(12) United States Patent
Wang et al.

(10) Patent No.: US 6,484,281 B1
(45) Date of Patent: Nov. 19, 2002

(54) SOFTWARE-BASED SIMULATION SYSTEM CAPABLE OF SIMULATING THE COMBINED FUNCTIONALITY OF A NORTH BRIDGE TEST MODULE AND A SOUTH BRIDGE TEST MODULE

(75) Inventors: Hsuan-Yi Wang, Yun-Lin Hsien (TW); Jiin Lai, Taipei (TW); Nai-Shung Chang, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 09/459,763

(22) Filed: Dec. 13, 1999

(30) Foreign Application Priority Data

Nov. 6, 1999 (TW) .......................................... 88117223 A

(51) Int. Cl.⁷ .............................................. G01R 31/28
(52) U.S. Cl. ....................................... 714/733; 714/734
(58) Field of Search ........................... 714/33, 798, 741, 714/733, 734; 395/500.42, 500.43, 50.44

(56) References Cited

U.S. PATENT DOCUMENTS

| 4,744,084 A | * | 5/1988 | Beck et al. ..................... 714/33 |
| 4,937,827 A | * | 6/1990 | Beck et al. ..................... 714/33 |
| 5,881,270 A | * | 3/1999 | Worthington et al. .. 395/500.42 |
| 5,946,472 A | * | 8/1999 | Graves et al. ......... 395/500.44 |
| 6,052,524 A | * | 4/2000 | Pauna .................... 395/500.43 |

* cited by examiner

Primary Examiner—David Ton
(74) Attorney, Agent, or Firm—J.C. Patents

(57) ABSTRACT

A software-based simulation system is provided, which can provide the combined functionality of a South Bridge test module and a North Bridge test module based solely on either one of the two modules, i.e., either the South Bridge test module or the North Bridge test module without having to use both. This software-based simulation system is characterized in the use of a PCI master modeling circuit and a PCI slave modeling circuit which are capable of simulating the functionality of the North Bridge chipset in the case that only the South Bridge chipset and no North Bridge chipset is included in the simulation system, and are further capable of simulating the functionality of the South Bridge chipset in the case that only the North Bridge chipset and no South Bridge chipset is included in the simulation system.

14 Claims, 3 Drawing Sheets

SOFTWARE-BASED SIMULATION SYSTEM CAPABLE OF SIMULATING THE COMBINED FUNCTIONALITY OF A NORTH BRIDGE TEST MODULE AND A SOUTH BRIDGE TEST MODULE

CROSS-REFERENCE TO RELATED APPLICATION

This application claims the priority benefit of Taiwan application serial no. 88117223, filed Oct. 6, 1999.

BACKGROUND OF THE INVENTION

1. Field of the Invention

This invention relates to computer technology, and more particularly, to a software-based simulation system which is capable of simulating the combined functionality of a South Bridge test module and a North Bridge test module with only one of the two test modules, i.e., either the South Bridge test module or the North Bridge test module without having to use both.

2. Description of Related Art

A simulating North Bridge chipset is a test circuit that is specifically designed for use on a computer motherboard for simulating the functionality of an actual Host-to-PCI bridge controller, while a simulating South Bridge chipset is another type of test circuit that is specifically designed for simulating the functionality of the various kinds of actual peripheral devices connected to the motherboard via such interfaces as ISA (Industry Standard Architecture), IDE (Integrated Device Electronics), USB (Universal Serial Bus), and AC-Link interfaces.

Before tape-out, an IC chipset is typically tested through simulation for the purpose of checking whether the IC chipset would function properly. When the design of an IC chipset is completed, the designed circuit architecture is mathematically simulated to check whether it would functionally meet the design specifications. Then, after the layout is completed, timing factors such as delays and electrical characteristics are added to the circuit for a second simulation.

The testing for an IC chipset can be carried out in two ways: a hardware-based testing method and a software-based testing method. By the hardware-based testing method, a prototype device is made in accordance with the designed circuit diagram, which is then mounted on a customized hardware circuit board made to function in conjunction with the tested device. The hardware-based testing method can check whether the designed IC chipset would function properly when practically implemented.

One advantage to the hardware-based testing method is that it is a fast testing procedure so that the testing can be completed in a short time. One drawback of the hardware-based testing method, however, is that it requires the settings of various parameters and mounting of various circuit components for the testing of different types of IC chipsets, and this work would typically require a team of more than 20 technicians to achieve. This makes the hardware-based testing method quite laborious and time-consuming to achieve, and is therefore quite cost-ineffective to implement.

The software-based testing method, on the other hand, performs the testing through a simulation software program, which is coded by a special programming language, such as Verlog code, for modeling the designed IC chipset. The simulation program can compute for the input/output characteristics of the designed IC chipset.

A conventional setup for implementing the software-based testing method is to use a North Bridge test module and a South Bridge test module. The North Bridge test module includes a simulation circuit that is designed to simulate the functionality of a Host-to-PCI bridge controller, and further includes a CPU, a memory unit, an AGP device, and a PCI bus. The South Bridge test module includes a simulation circuit that is designed to simulate a PCI-to-ISA bridge controller, and further includes an IDE interface, an AC-Link interface, a USB interface, an ISA bus, a PCI bus, an LPC bus, and an SM bus. The South Bridge chipset is used to test the peripheral devices connected via these interfaces thereto.

FIG. 1 is a schematic block diagram showing a conventional chipset system including the North Bride and South Bridge. In FIG. 1, the system includes a North Bride module, a South Bridge module, and a PCI bus 30 between them. The North Bridge module includes a central processing unit (CPU) 5, an advanced graphics port (AGP) 10, a memory unit 15, a North Bridge test circuit 20, and a host bus 25. The South Bridge includes a South Bride test circuit 60, an LPC bus 65, a system manager (SM) bus 70, an ISA bus, a connection means for connecting the LPC bus 65, the SM bus 70, and the industry standard architecture (ISA) bus to the South Bridge test circuit 60, and a connection means for connecting an UBS device 55, an IDE device, and codec 50 to the South Bridge test circuit 60.

The connection means for connecting LPC bus 65, SM bus 70, and ISA bus to the South Bridge test circuit 60 includes a LPC device 68, an SM master 72, an SM slave 74, and ISA master 82, and an ISA slave 84.

The North Bride module and the South bridge module in FIG. 1 is coupled together through the PCI bus 30. The PCI bus also has couplings with a PCI master 35 and a PCI slave 40. The South Bridge circuit 60 is used to simulate a PCI/ISA bridge controller, and the North Bridge test circuit 20 is used to simulate a PCI/HOST bridge controller.

One advantage to the software-based testing method utilizing the South Bridge chipset and the North Bridge chipset is that it requires a reduced cost to implement as compared to the hardware-based testing method. One drawback to this software-based testing method, however, is that it is quite time-consuming since it requires the CPU to spend much time on the computation for the input/output response of each constituent component in the tested chipset.

Since the South Bridge chipset and the North Bridge chipset are both very complex in architecture, they are typically designed by two different teams of engineers. However, since the South Bridge chipset and the North Bridge chipset should work together to implement the software-based testing method, they must be finished in design and manufacture substantially at the same time. In the event that one team is behind schedule, the other team may waste time in waiting. This makes the project management quite difficult.

In summary, the prior art has the following drawbacks.

First, the hardware-based testing method requires a large amount of labor and time for system setup and parameter setting, and therefore is quite costly to implement.

Second, the software-based testing method is quite slow in speed since it would spend much time on the computation for the input/output response of each constituent component in the chipset including CPU, ISA devices, and memory.

Third, the software-based testing method would cause the project management quite difficult since the South Bridge chipset and the North Bridge chipset should be finished in design and manufacture substantially at the same time.

SUMMARY OF THE INVENTION

It is therefore an objective of this invention to provide a software-based simulation system which can be used in conjunction with either the South Bridge chipset or the North Bridge chipset, but can nonetheless perform the combined functionality of the South Bridge chipset and the North Bridge chipset.

It is another objective of this invention to provide a software-based simulation system, which allows the testing to be completed in a shorter time than the prior art, so that the testing can be more efficiently implemented.

It is still another objective of this invention to provide a software-based simulation system, which allows the testing to be implemented in a more cost-effective manner than the prior art.

It is yet another objective of this invention to provide a software-based simulation system, which allows the project management for its design and implementation to be easier than the prior art.

In accordance with the foregoing and other objectives, a novel software-based simulation system is proposed. The software-based simulation system of the invention is characterized in that it is based solely on either the South Bridge chipset or the North Bridge chipset but can nonetheless provide the combined fuinctionality of both chipsets. This feature allows the benefits of reduced testing time, easy project management, and reduced amount of memory as compared to the prior art. The invention is therefore more advantageous to use than the prior art.

More specifically, the software-based simulation system of the invention is characterized in the use of a PCI master modeling circuit and a PCI slave modeling circuit which can simulate the functionality of the North Bridge chipset in the case that only the South Bridge chipset and no North Bridge chipset is included in the simulation system, and are further capable of simulating the functionality of the South Bridge chipset in the case that only the North Bridge chipset and no South Bridge chipset is included in the simulation system.

In the case of no North Bridge chipset, the software-based simulation system of the invention includes a South Bridge chipset capable of simulating the functionality of a PCI-to-ISA bridge controller; a PCI master modeling circuit coupled via a PCI bus to the South Bridge chipset, which is capable of simulating the functionality of a PCI master unit, and is capable of processing a North-Bridge-specific set of input/output signals that are specific to the North Bridge chipset; a PCI slave modeling circuit coupled via the PCI bus to the South Bridge chipset, which is capable of simulating the functionality of a PCI slave unit, and is capable of delivering a wait state for simulating the delay in the memory access operation in the North Bridge chipset, and is further capable of performing a retry-count function for simulating the effect of delayed transaction in the North Bridge chipset; and a PCI arbitrator simulation circuit coupled via the PCI bus to the South Bridge chipset, which is capable of simulating the functionality of a PCI arbitrator.

In the case of using the PCI master modeling circuit to simulate the functionality of the North Bridge chipset, the PCI master modeling circuit is used to process a North-Bridge-specific set of input/output signals. In a system with both the South Bridge chipset and the North Bridge chipset, these input/output signals are supposed to be generated and received by the North Bridge chipset. In the case of using the PCI slave modeling circuit to simulate the functionality of the North Bridge chipset, the PCI slave modeling circuit is put in a waiting state for the purpose of simulating the delay in the memory access operation in the North Bridge chipset. Further, the PCI slave modeling circuit can perform a retry-count function which can simulate the effect of delayed transaction in the North Bridge chipset.

The North-Bridge-specific output cycles include IOR (Input/Output Read) cycle, IOW (Input/Output Write) cycle, MEMR (Memory Read) cycle, MEMW (Memory Write) cycle, INTA (Interrupt Acknowledge) cycle, and SC (Special Cycle); while the North-Bridge-specific input signals include INTR (Interrupt Request) signal, INIT (Initiation) signal, and STPCLK (Stop Clock) signal.

In addition, during a PCI read cycle to an internal memory unit, the PCI slave modeling circuit will first check whether the requested data is stored in the internal memory unit; if YES, the PCI slave modeling circuit will retrieve the requested data from the internal memory unit; otherwise, if NO, the PCI slave modeling circuit will generate a random piece of data for transmission.

Conclusively, the PCI master modeling circuit can be used to substitute for the CPU in the North Bridge chipset, while the PCI slave modeling circuit can be used to substitute for the internal memory of the North Bridge chipset.

In the case of no South Bridge chipset, the software-based simulation system of the invention includes: a North Bridge chipset capable of simulating the functionality of a Host-to-PCI bridge controller; a PCI master modeling circuit coupled via a PCI bus to the North Bridge chipset, which is capable of simulating the functionality of a PCI master unit, and further capable of outputting a South-Bridge-specific set of master signals that are specific to the South Bridge chipset; and a PCI slave modeling circuit coupled via the PCI bus to the North Bridge chipset, which is capable of simulating the functionality of a PCI slave unit, and capable of performing a subtrative decoding function for simulating the subtrative decoding function of the South Bridge test module, and capable of processing a set of input signals specific to the South Bridge test module, and further capable of performing a retry-count function for simulating the effect of delayed transaction in the North Bridge test module.

The above-mentioned master signals include an INTR (Interrupt Request) signal, an INIT (Initiation) signal, and an STPCLK (Stop Clock) signal. In a system with both the South Bridge chipset and the North Bridge chipset, these master signals are supposed to be generated by the South Bridge chipset.

The PCI slave modeling circuit is designed to simulate the functionality of a PCI-compliant slave unit. However, the PCI slave modeling circuit can perform a subtrative decoding function for simulating the subtrative decoding function of the South Bridge test module, and capable of processing a set of input signals specific to the South Bridge test module, and further capable of performing a retry-count function for simulating the effect of delayed transaction in the North Bridge test module.

The PCI slave modeling circuit can receive and process a South-Bridge-specific set of input cycles, including a CFGR (Configured Read) cycle, a CFGW (Configured Write) cycle, an INTA (Interrupt Acknowledge) cycle, and an SC (Special Cycle) cycle.

In addition, during a PCI read cycle to an internal memory unit, the PCI slave modeling circuit will first check whether the requested data is stored in the internal memory unit; if YES, the PCI slave modeling circuit will retrieve the requested data from the internal memory unit; otherwise, if NO, the PCI slave modeling circuit will generate a random piece of data for transmission.

Conclusively, the PCI master modeling circuit can be used to substitute for the master function of the South Bridge chipset, while the PCI slave modeling circuit, with the subtrative decoding function, can be used to substitute for the slave function of the South Bridge chipset.

Through experimentation, it is found that the software-based simulation system of the invention, whether implemented with only the South Bridge chipset or the North Bridge chipset, is three times faster in testing speed than a conventional simulation system with both the South Bridge chipset and the North Bridge chipset.

In conclusion, the software-based simulation system of the invention is characterized in the use of a PCI master modeling circuit and a PCI slave modeling circuit which are capable of simulating the functionality of the North Bridge chipset in the case that only the South Bridge chipset and no North Bridge chipset is included in the simulation system, and are further capable of simulating the functionality of the South Bridge chipset in the case that only the North Bridge chipset and no South Bridge chipset is included in the simulation system. This feature allows the benefits of reduced testing time, easy project management, and reduced amount of memory as compared to the prior art. The invention is therefore more advantageous to use than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Embodiment 1

Figure 2:
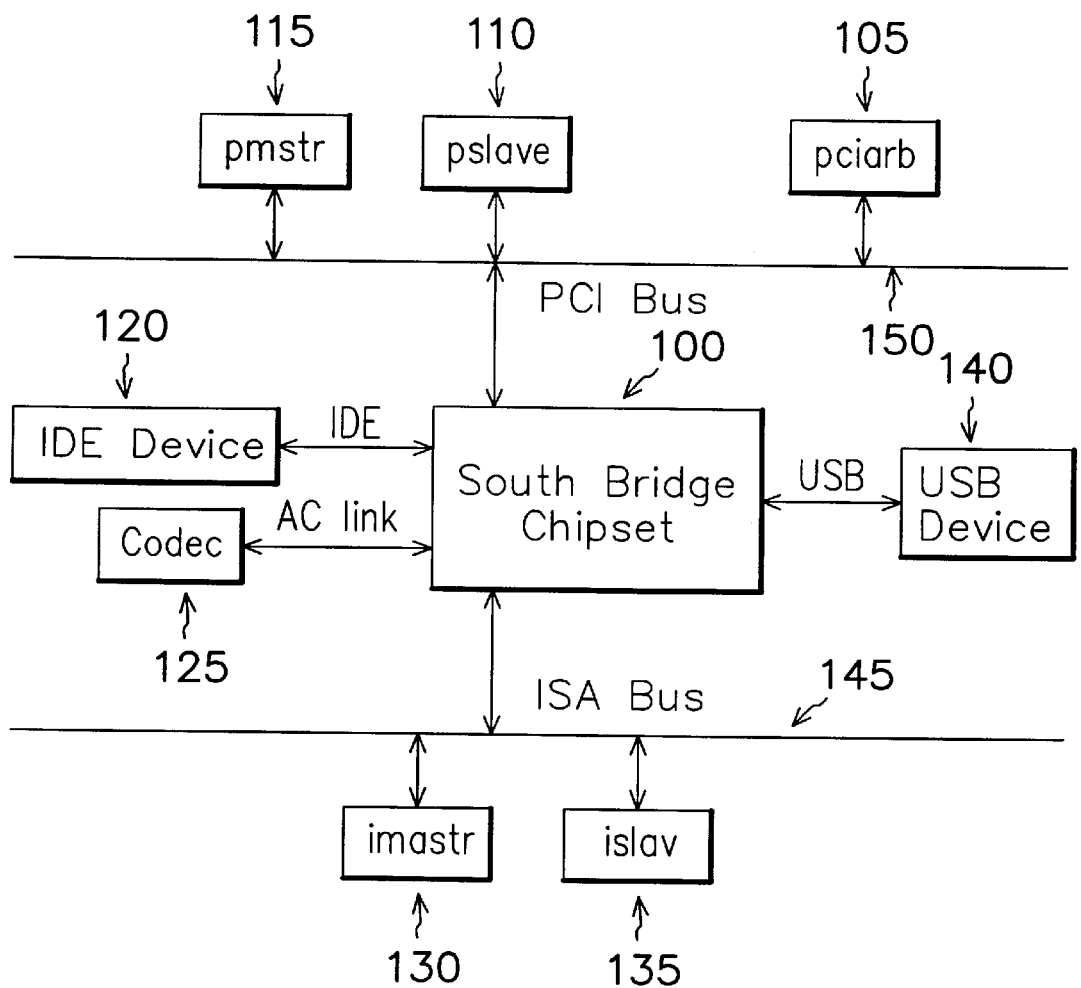
FIG. 2 is a schematic block diagram showing a first preferred embodiment of the software-based simulation system of the invention which is used in conjunction with the South Bridge chipset.

FIG. 2 is a schematic block diagram showing a first preferred embodiment of the software-based simulation system of the invention which is used in conjunction with a South Bridge chipset (designated by the reference numeral 100) without the use of a North Bridge chipset. In this diagram, the LPC bus and the SM bus are not related to the spirit and scope of the invention and are therefore eliminated for simplification of the description. As shown, the software-based simulation system of the invention is designed for use with a South Bridge chipset 100 which is used to simulate the functionality of a PCI-to-ISA bridge controller. The South Bridge chipset 100 is connected between a PCI bus 150 and an ISA bus 145 and is coupled via an IDE interface to an IDE device 120, via an AC-Link interface to a codec unit 125, and via a USB interface to a USB device 140. Further, the South Bridge chipset 100 is coupled via the PCI bus 150 to a PCI master modeling circuit (pmstr) 115, a PCI slave modeling circuit (pslave) 110, and a PCI arbiFile: trator simulation circuit (pciarb) 105, and via the ISA bus 145 to an ISA master simulation circuit (imastr) 130 and an ISA slave simulation circuit (islav) 135.

In this embodiment, the South Bridge chipset 100 is used to simulate performances about the PCI-to-ISA bridge controller in a real circuit.

The PCI master modeling circuit 115 is designed to simulate the functionality of a PCI master unit and is capable of generating a North-Bridge-specific set of output cycles in addition to the PCI-specific output cycles, including IOR (Input/Output Read) cycle, IOW (Input/Output Write) cycle, MEMR (Memory Read) cycle, MEMW (Memory Write) cycle, INTA (Interrupt Acknowledge) cycle, and SC (Special Cycle) cycle. Further, the PCI master modeling circuit 115 can receive and process a North-Bridge-specific set of input signals in addition to the PCI-specific input signals, including INTR (Interrupt Request) signal, INIT (Initiation) signal, and STPCLK (Stop Clock) signal.

The PCI slave modeling circuit 110 is designed to simulate the functionality of a PCI slave unit. The input/output signal specification of the PCI slave modeling circuit 110 is entirely the same as those of a PCI slave unit.

In accordance with the invention, the foregoing simulation system is designed for use only with the South Bridge chipset 100 but can nonetheless simulate the combined functionality of a South Bridge chipset and a North Bridge chipset. As mentioned in the background section of this specification, the North Bridge chipset is used to simulate the functionality of a Host-to-PCI bridge controller. In the simulation system of FIG. 1, the functionality of the North Bridge chipset is simulated by the PCI master modeling circuit 115 or the PCI slave modeling circuit 110 as described in the following.

In the case of using the PCI master modeling circuit 115 to simulate the functionality of the North Bridge chipset, the PCI master modeling circuit 115 is used to generate the above-mentioned output cycles IOR, IOW, MEMR, INTA, and SC, and also receive and process the above-mentioned input signals INTR, INIT, and STPCLK. In a system with both the South Bridge chipset and the North Bridge chipset, these input/output signals are supposed to be generated and received by the North Bridge chipset.

In the case of using the PCI slave modeling circuit 110 to simulate the functionality of the North Bridge chipset, the PCI slave modeling circuit 110 is put in a waiting state for the purpose of simulating the delay in the memory access operation in the North Bridge chipset. Further, the PCI slave modeling circuit 110 can perform a retry-count function which can simulate the effect of delayed transaction in the North Bridge chipset.

In addition, during a PCI read cycle to an internal memory unit, the PCI slave modeling circuit 110 will first check whether the requested data is stored in the internal memory unit; if YES, the PCI slave modeling circuit 110 will retrieve the requested data from the internal memory unit; otherwise, if NO, the PCI slave modeling circuit 110 will generate a random piece of data for transmission.

As shown in FIG. 2, the PCI master modeling circuit 115, the PCI slave modeling circuit 110, and the PCI arbitrator simulation circuit 105 are coupled via the PCI bus 150 to the South Bridge chipset 100. This allows them to communicate with each other and with the South Bridge chipset 100. When simulating the North Bridge chipset, the PCI master modeling circuit 115 and the PCI slave modeling circuit 110 also transfer the input/output signals specific to the North Bridge chipset via the PCI bus 150. Therefore, even without the use of the North Bridge chipset, the simulation system can nonetheless provide the combined functionality of the South Bridge chipset and the North Bridge chipset.

Embodiment 2

Figure 3:
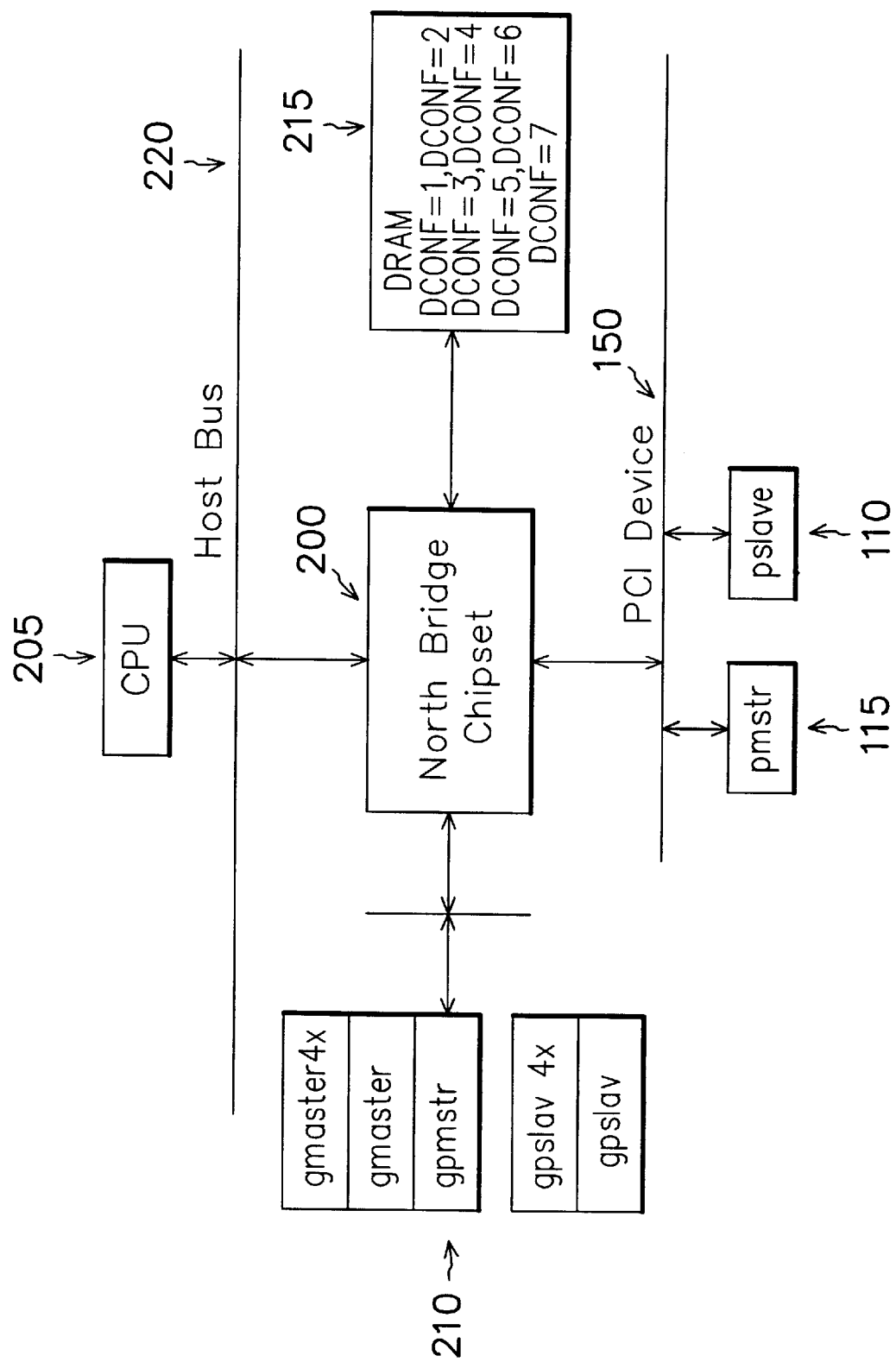
FIG. 3 is a schematic block diagram showing a second preferred embodiment of the software-based simulation system of the invention which is used in conjunction with the North Bridge chipset.

FIG. 3 is a schematic block diagram showing a second preferred embodiment of the software-based simulation system of the invention which is used in conjunction with a North Bridge chipset (as designated by the reference numeral 200). As shown, the North Bridge chipset 200 is connected between a host bus 220 and a PCI bus 150. The host bus 220 is coupled to a CPU 205, while the PCI bus 150 is coupled to a PCI master modeling circuit 115 and a PCI slave modeling circuit 110. The PCI master modeling circuit 115 is designed to simulate the functionality of a PCI-compliant master unit, except that it is further capable of outputting a South-Bridge-specific set of master signals in addition to the PCI-specific input/output signals. These master signals include an INTR (Interrupt Request) signal, an INIT (Initiation) signal, and an STPCLK (Stop Clock) signal.

The PCI slave modeling circuit 110 is designed to simulate the functionality of a PCI-compliant slave unit. However, in accordance with the invention, the PCI slave modeling circuit 110 is further capable of performing a subtrative decoding function and a retry-count function, and also capable of receiving and processing a South-Bridge-specific set of input cycles, including a CFGR (Configured Read) cycle, a CFGW (Configured Write) cycle, an INTA (Interrupt Acknowledge) cycle, and an SC (Special Cycle) cycle.

In the simulation system shown in FIG. 3, the North Bridge chipset 200 is used to simulate the functionality of a Host-to-PCI bridge controller to allow data communication between the host bus 220 and the PCI bus 150. In addition, the North Bridge chipset 200 can communicates via the host bus 220 with the CPU 205 and via the PCI bus 150 with the PCI master modeling circuit 115 and the PCI slave modeling circuit 110. Moreover, the North Bridge chipset 200 is coupled to a memory unit 215 and an AGP device 210.

Figure 1:
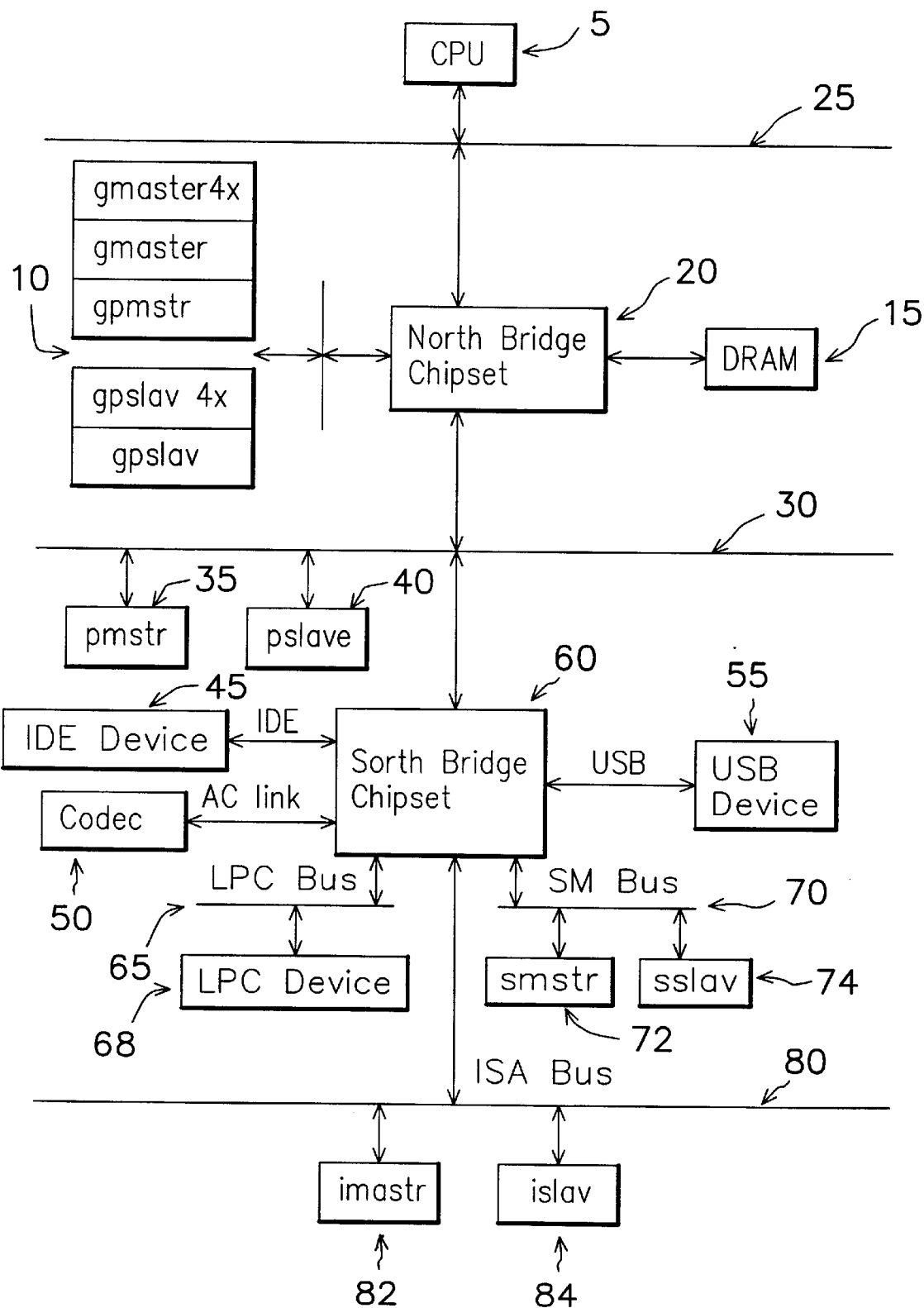
FIG. 1 is a schematic block diagram showing a conventional simulation system used testing the North Bride and South Bridge together.

In accordance with the invention, the PCI master modeling circuit 115 or the PCI slave modeling circuit 110 can be used to simulate the functionality of the South Bridge chipset 100 shown in FIG. 1 so that the simulation system of FIG. 3 can work without using the South Bridge chipset. To achieve this, the PCI master modeling circuit 115 is designed to output a South-Bridge-specific set of master signals including the above-mentioned INTR, INIT, and STPCLK signals. In a system with both the South Bridge chipset and the North Bridge chipset, these output signals are supposed to be generated by the South Bridge chipset.

On the other hand, if the PCI slave modeling circuit 110 is used to simulate the functionality of the South Bridge chipset 100, it performs a subtrative decoding function and a retry-count function which are supposed to be performed by the South Bridge chipset and receives and processes a South-Bridge-specific set of input cycles including the CFGR cycle, the CFGW cycle, the INTA cycle, and the SC cycle. In a system with both the South Bridge chipset and the North Bridge chipset, these input signals are supposed to be received and processed by the South Bridge chipset.

In addition, during a PCI read cycle to an internal memory unit, the PCI slave modeling circuit 110 will first check whether the requested data is stored in the internal memory unit; if YES, the PCI slave modeling circuit 110 will retrieve the requested data from the internal memory unit; otherwise, if NO, the PCI slave modeling circuit 110 will generate a random piece of data for transmission.

As shown in FIG. 3, the PCI master modeling circuit 115 and the PCI slave modeling circuit 110 are coupled via the PCI bus 150 to the North Bridge chipset 200. This allows them to communicate with each other and with the North Bridge chipset 200 when simulating the functionality of the South Bridge chipset.

In conclusion, the invention provides a software-based simulation system which can simulate the combined functionality of a South Bridge chipset and a North Bridge chipset through a PCI master modeling circuit and a PCI slave modeling circuit. The software-based simulation system is characterized in that it is based solely on either the South Bridge chipset or the North Bridge chipset but can nonetheless provide the combined functionality of both chipsets. In the case that only the South Bridge chipset and no North Bridge chipset is included in the simulation system, the PCI master modeling circuit and the PCI slave modeling circuit are used to simulate the functionality of the North Bridge chipset; and whereas in the case that only the North Bridge chipset and no South Bridge chipset is included in the simulation system, the PCI master modeling circuit and the PCI slave modeling circuit are used to simulate the functionality of the South Bridge chipset. This feature allows the benefits of reduced testing time, easy project management, and reduced amount of memory as compared to the prior art. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A software-based system used for simulating the combined functionality of a South Bridge test module and a North Bridge test module, comprising:
   a South Bridge chipset used for simulating the functionality of a PCI-to-ISA bridge controller;
   a PCI master modeling circuit coupled via a PCI bus to the South Bridge chipset, which can simulate the functionality of a PCI master unit, and can process a North-Bridge-specific set of input/output signals;
   a PCI slave modeling circuit coupled via the PCI bus to the South Bridge chipset, which can simulate the functionality of a PCI slave unit, and can deliver a wait state for simulating the delay in the memory access operation in a North Bridge chipset, and can further perform a retry-count function for simulating the effect of delayed transaction in the North Bridge chipset; and a PCI arbitrator simulation circuit coupled via the PCI bus to the South Bridge chipset, which can simulate the functionality of a PCI arbitrator.

2. The software-based simulation system of claim 1, wherein the North-Bridge-specific output cycles from the PCI master simulation circuit include an IOR (Input/Output Read) cycle, an IOW (Input/Output Write) cycle, an MEMR (Memory Read) cycle, an MEMW (Memory Write) cycle, an INTA (Interrupt Acknowledge) cycle, and an SC (Special Cycle) cycle.

3. The software-based simulation system of claim 1, wherein the North-Bridge-specific input signals to the PCI master modeling circuit include an INTR (Interrupt Request) signal, an INIT (Initiation) signal, and an STPCLK (Stop Clock) signal.

4. The software-based simulation system of claim 1, wherein the PCI slave modeling circuit can further check whether the requested data is stored in the memory unit during a PCI read cycle to a memory unit, if YES, retrieving the requested data from the memory unit; otherwise, if NO, generating a random piece of data for transmission.

5. The software-based simulation system of claim 1, wherein the North Bridge test module includes:
   a North Bridge chipset used for simulating the functionality of a Host-to-PCI bridge controller;
   a CPU simulation unit, coupled via a host bus to the North Bridge chipset, for simulating the functionality of a CPU;
   a memory simulation unit, coupled to the North Bridge chipset, for simulating the functionality of a memory device; and
   an AGP simulation unit, coupled to the North Bridge chipset, for simulating the functionality of an AGP device.

6. The software-based simulation system of claim 5, wherein the PCI master modeling circuit can further simulate the functionality of the CPU.

7. The software-based simulation system of claim 5, wherein the PCI slave modeling circuit can further simulate the functionality of the memory unit.

8. A software-based simulation system used for simulating the combined functionality of a South Bridge test module and a North Bridge test module, comprising:
   a North Bridge chipset used for simulating the functionality of a Host-to-PCI bridge controller;
   a PCI master modeling circuit coupled via a PCI bus to the North Bridge chipset, which can simulate the functionality of a PCI master unit, and further can output a South-Bridge-specific set of master signals that are specific to a South Bridge chipset; and
   a PCI slave modeling circuit coupled via the PCI bus to the North Bridge chipset, which can simulate the functionality of a PCI slave unit, and can perform a substrative decoding function for simulating the substrative decoding function of the South Bridge test module, and can process a set of input signals specific to the South Bridge test module, and can perform a retry-count function for simulating the effect of delayed transaction in the North Bridge test module.

9. The software-based simulation system of claim 8, wherein the South Bridge test module includes:
   a South Bridge chipset used for simulating the functionality of a PCI-to-ISA bridge controller;
   an IDE interface for coupling an IDE-compatible peripheral device to the South Bridge chipset;
   an AC-Link interface for coupling an AC-Link-compatible peripheral device to the South Bridge chipset; and
   a USB interface for coupling a USB-compatible peripheral device to the South Bridge chipset.

10. The software-based simulation system of claim 8, wherein the South-Bridge-specific set of output master signals from the PCI master modeling circuit include an INTR (Interrupt Request) signal, an INIT (Initiation) signal, and an STPCLK (Stop Clock) signal.

11. The software-based simulation system of claim 8, wherein the PCI master modeling circuit can further serve as a master unit of the South Bridge test modules.

12. The software-based simulation system of claim 8, wherein the PCI slave modeling circuit can further serve as a slave unit of the South Bridge test module.

13. The software-based simulation system of claim 8, wherein the South-Bridge-specific input cycles to the PCI slave modeling circuit include a CFGR (Configured Read) cycle, a CFGW (Configured Write) cycle, an INTA (Interrupt Acknowledge) cycle, and an SC (Special Cycle) cycle.

14. The software-based simulation system of claim 8, wherein the PCI slave modeling circuit can further check whether requested data is stored in the memory unit, during a PCI read cycle to a memory unit, if YES, retrieving the requested data from the memory unit; otherwise, if NO, generating a random piece of data for transmission.

* * * * *